US010509370B1

(12) United States Patent
Lemke et al.

(10) Patent No.: US 10,509,370 B1
(45) Date of Patent: Dec. 17, 2019

(54) VAPOR CELL HEATING ASSEMBLY

(71) Applicant: Government of the United States, as represented by the Secretary of the Air Force, Kirtland AFB, NM (US)

(72) Inventors: Nathan D. Lemke, Albuquerque, NM (US); Christopher J. Erickson, Salisbury (GB); Jordan L. Armstrong, Durango, CO (US); Kyle W. Martin, Albuquerque, NM (US)

(73) Assignee: GOVERNMENT OF THE UNITED STATES OF AMERICA AS REPRESENTED BY THE SECRETARY OF THE AIR FORCE, Washington, DC (US)

( * ) Notice: Subject to any disclaimer, the term of this patent is extended or adjusted under 35 U.S.C. 154(b) by 128 days.

(21) Appl. No.: 15/946,350

(22) Filed: Apr. 5, 2018

(51) Int. Cl.
  *G04F 5/14* (2006.01)
(52) U.S. Cl.
  CPC ..................... *G04F 5/14* (2013.01)
(58) Field of Classification Search
  CPC ........................................................ G04F 5/14
  USPC ......................................................... 331/94.1
  See application file for complete search history.

(56) References Cited

U.S. PATENT DOCUMENTS

| 5,703,276 | A | 12/1997 | Flanigan |
| 8,258,884 | B2 | 9/2012 | Borwick, III et al. |
| 8,319,156 | B2 | 11/2012 | Borwick, III et al. |
| 2012/0313717 | A1* | 12/2012 | Ridley ................ G04F 5/145 331/94.1 |
| 2014/0096607 | A1* | 4/2014 | Schober ................ G04F 5/14 73/431 |

OTHER PUBLICATIONS

Erickson, C. et al., "High-temperature calcium vapor cell for spectroscopy on the 4s2 1 S0-4s4p 3 P1 intercombination line," Review of Scientific Instruments 76, 123110-1 through 123110-5, 2005.
Armstrong, J. et al., "Robust Optical Clocks Based on Alkaline-Earth Vapor Cells," Proceedings of the 2016 Precise Time and Time Interval Meeting, ION PTTI 2016, Monterey, CA, Jan. 25-28, 2016, pp. 147-149.
Armstrong, J. et al., "Thermal Design of High Temperature Alkaline-Earth Vapor Cells," PProc. SPIE 9763, Slow Light, Fast Light, and Opto-Atomic Precision Metrology IX, 976303, Mar. 7, 2016, 4 pages.

(Continued)

*Primary Examiner* — Joseph Chang
(74) *Attorney, Agent, or Firm* — James M. Skorich

(57) ABSTRACT

A vapor cell heating assembly, method, and high temperature optical system including a vapor cell having exterior surfaces; a slide disposed on at least one exterior surface of the vapor cell; a heating element disposed on the at least one exterior surface, the heating element including a frame and a first opening in the frame to pass light through the frame to the at least one exterior surface; and a shell disposed on the vapor cell to hold the slide and heating element to the vapor cell, wherein the shell includes a plurality of structural elements, each structural element disposed on a corresponding exterior surface of the vapor cell and aligned to adjacent structural elements at edges, and wherein each structural element includes a second opening to pass light through the structural element to a respective exterior surface.

20 Claims, 10 Drawing Sheets

(56) References Cited

OTHER PUBLICATIONS

Armstrong, J. et al., "Thermal Design of High Temperature Alkaline-Earth Vapor Cells," Poster, International Frequency Control Symposium Poster Session, May 11, 2016, one page.

Erickson, C. et al., "Robust Optical Clocks Based on Alkaline-Earth Vapor Cells," Frontiers in Optics/Laser Science, Oct. 20, 2015, one page.

* cited by examiner

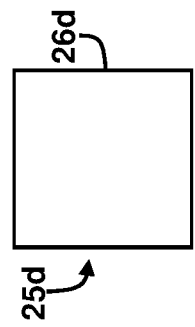
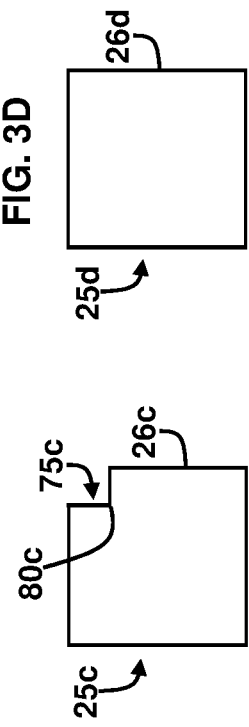
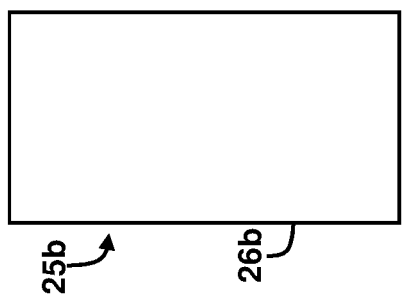
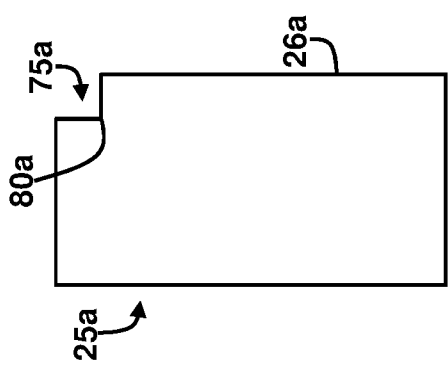
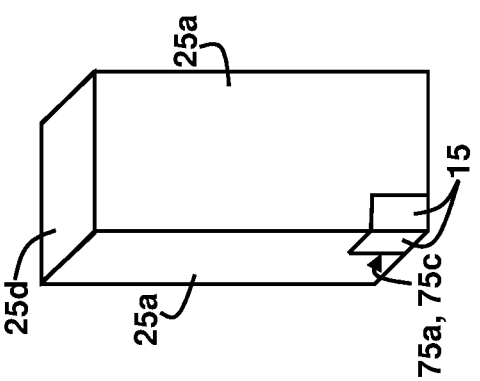
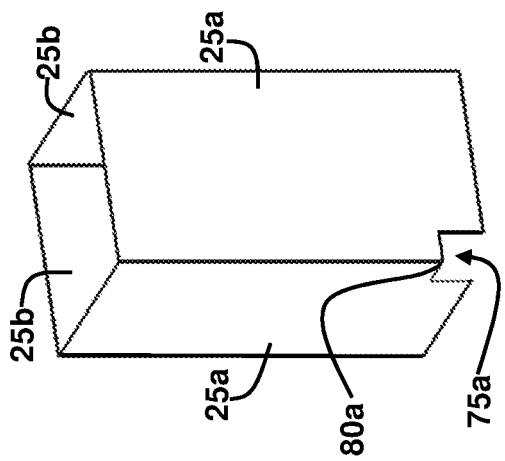

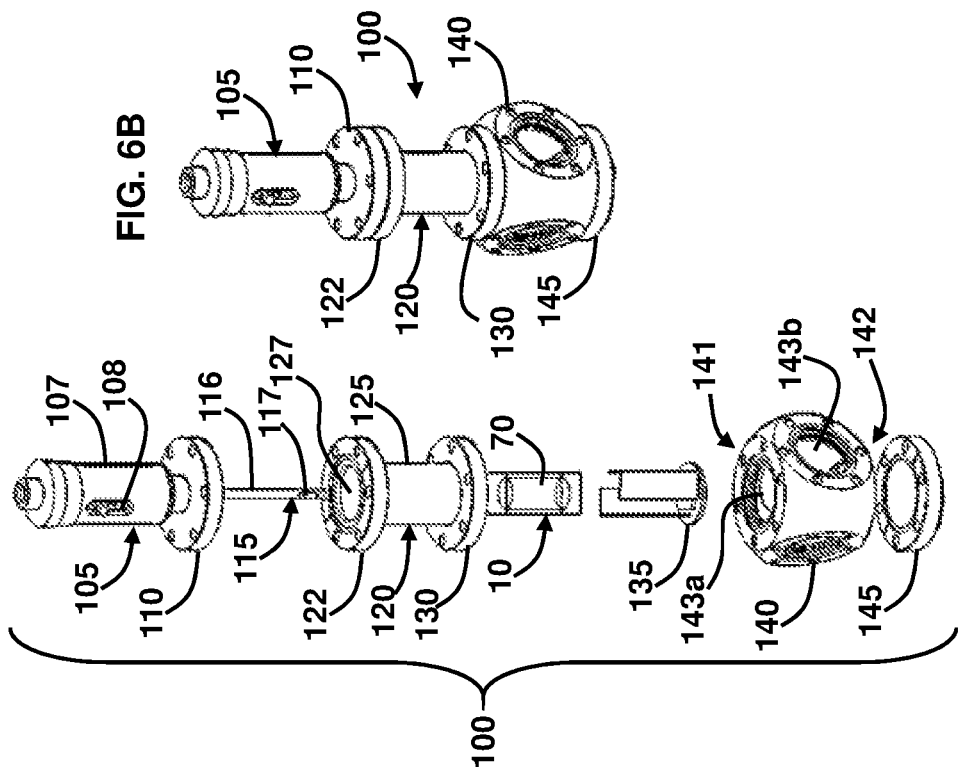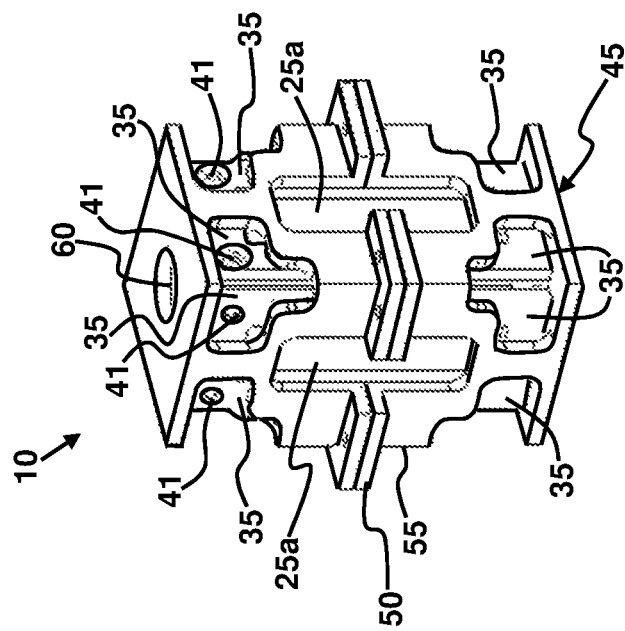

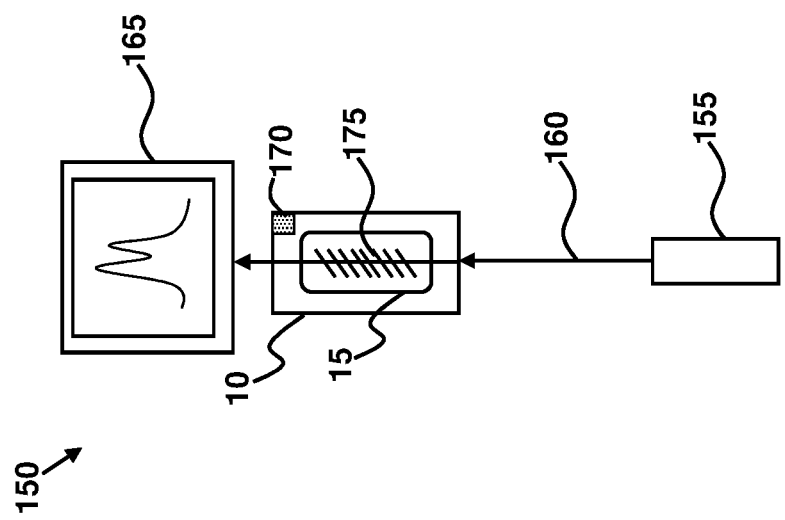

US 10,509,370 B1

VAPOR CELL HEATING ASSEMBLY

GOVERNMENT INTEREST

The invention described herein may be manufactured and used by or for the Government of the United States for all government purposes without the payment of any royalty.

CROSS-REFERENCE TO RELATED APPLICATION

This application relates to U.S. patent application Ser. No. 15/946,115 filed on Apr. 5, 2018 and titled "Method of Manufacturing a Vapor Cell for Alkaline-Earth-Like Atoms Inside an Ultrahigh Vacuum Chamber," the entire disclosure of which is herein incorporated by reference.

BACKGROUND

Field of the Invention

The embodiments herein generally relate to vapor cells, and more particularly to a vapor cell heating assembly.

Background of the Invention

Alkaline-earth atoms including calcium, strontium, magnesium, barium, radium, zinc, cadmium, and ytterbium are known to possess spectrally narrow electronic transitions that can be accessed with visible laser sources. These narrow transitions form the basis for the world's most precise clocks, and have other appealing metrological features that find application in magnetometry, atom interferometry, formation and study of Bose-Einstein Condensates, and searches for physics beyond the Standard Model. However, accessing these transitions requires a dense and sometimes cold source of atomic vapor, which is challenging due to the low vapor pressure of these atoms. Research shows that certain glasses and crystalline materials may be able to contain vapors of these atoms at the requisite temperature without damage. However, forming a pure environment free from background particles is not generally possible due to the inability to have a fill port through which the background gas could be removed, and the desired alkaline-earth material could be added. A second complication, were a vapor cell to exist, is that many of the above applications require high optical access, including (in the case of a vapor cell whose shape is a rectangular prism) from all six faces, but this is generally incompatible with the need to heat and insulate the vapor cell to support the needed temperature (typically between 400-600° C.) to form a vapor.

BRIEF SUMMARY OF THE INVENTION

In view of the foregoing, an embodiment herein provides a vapor cell heating assembly comprising a vapor cell comprising exterior surfaces; a slide disposed on at least one exterior surface of the vapor cell; a heating element disposed on the at least one exterior surface, the heating element comprising a frame and a first opening in the frame to pass light through the frame to the at least one exterior surface; and a shell disposed on the vapor cell to hold the slide and heating element to the vapor cell, wherein the shell comprises a plurality of structural elements, each structural element disposed on a corresponding exterior surface of the vapor cell and aligned to adjacent structural elements at edges, and wherein each structural element comprises a second opening to pass light through the structural element to a respective exterior surface.

The vapor cell may further comprise an interior surface defining a sealed inner chamber comprising a vacuum of less than or equal to $10^{-6}$ Torr and an alkaline-earth material. The vapor cell may comprise at least one of sapphire, calcium fluoride ($CaF_2$), and europium-doped calcium fluoride ($CaF_2$:Eu). The assembly may further comprise a plurality of slides, wherein each exterior surface of the vapor cell has a slide disposed thereon; and a plurality of heating elements, wherein the plurality of heating elements circumscribe the vapor cell disposed on corresponding side exterior surfaces thereof. Each slide may comprise a notch in a corner adjacent to the notch in adjacent slides to expose the underlying exterior surface of the vapor cell at a corner of the exterior surfaces. The heating element may comprise tungsten encased in aluminum nitride. The shell may comprise copper. The shell may comprise an integral first portion and a complementary integral second portion aligned to the integral first portion to form an interior volume and hold the slide and heating element to the vapor cell exterior surface in the interior volume of the first portion joined to the second portion.

Another embodiment provides a method of manufacturing a vapor cell heating assembly, the method comprising disposing a body component of a vapor cell in a vacuum chamber over-pressurized with inert gas, wherein the body component comprises an inner chamber open to the vacuum chamber; disposing an alkaline-earth material in the inner chamber; disposing an endcap of the vapor cell in the vacuum chamber; evacuating the vacuum chamber to less than or equal to $10^{-6}$ Torr; pressing the endcap into optical contact with the body component to seal the inner chamber while under vacuum less than or equal to $10^{-6}$ Torr to form a vapor cell; disposing a slide on at least one exterior surface of the vapor cell; disposing a heating element on the at least one exterior surface, the heating element comprising a frame and a first opening in the frame to pass light through the frame to the at least one exterior surface; and disposing a shell on the vapor cell to hold the slide and heating element to the vapor cell, wherein the shell comprises a plurality of structural elements, each structural element disposed on a corresponding exterior surface of the vapor cell and aligned to adjacent structural elements at edges, and wherein each structural element comprises a second opening to pass light through the structural element to a respective exterior surface.

Pressing the endcap into optical contact with the body component to seal the inner chamber may comprise securing a feedthrough component on a flange of the vacuum chamber, wherein the feedthrough component comprises a manipulator end to move within the vacuum chamber in response to input from outside the vacuum chamber; attaching the endcap to the manipulator end; positioning the endcap on the body component to close the inner chamber and moving the manipulator end to space the endcap apart from the body component during evacuation to less than or equal to $10^{-6}$ Torr; and moving the manipulator end to press the endcap into optical contact with the body component to seal the inner chamber while under vacuum of less than or equal to $10^{-6}$ Torr. The method may further comprise heating the body component prior to pressing the endcap into optical contact with the body component to seal the inner chamber while under vacuum less than or equal to $10^{-6}$ Torr. The alkaline-earth material may comprise at least one of calcium, strontium, magnesium, barium, radium, zinc, cadmium, and ytterbium.

The vapor cell may comprise at least one of sapphire, calcium fluoride ($CaF_2$), and europium-doped calcium fluoride ($CaF_2$:Eu). The heating element may comprise tungsten encased in aluminum nitride. The shell may comprise copper. Disposing the shell on the vapor cell may comprise disposing the vapor cell having the slide and heating element on the exterior surface thereof in an integral first portion of the shell; disposing a second integral portion of the shell on the integral first portion to hold the slide and heating element to the vapor cell exterior surface in an interior volume formed by the integral first portion and integral second portion; and adjoining the integral first portion of the shell to the integral second portion of the shell.

Another embodiment provides a high temperature optical system comprising a vapor cell heating assembly comprising a vapor cell comprising an exterior surface and an interior surface defining a sealed inner chamber comprising a vacuum of less than or equal to $10^{-6}$ Torr and an alkaline-earth material; a slide disposed on the exterior surface of the vapor cell; a heating element disposed on the exterior surface, the heating element comprising a frame and a first opening in the frame to pass light therethrough to the exterior surface; and a shell disposed on the vapor cell to hold the slide and heating element to the vapor cell, wherein the shell comprises a plurality of structural elements, each structural element aligned to adjacent structural elements, and wherein each structural element comprises a second opening to pass light therethrough to the exterior surface. The high temperature optical system further comprises a laser source to project a laser beam through the first and second openings, the exterior surface, the interior surface, and into the sealed inner chamber of the vapor cell.

The alkaline-earth material may be in the form of a vapor between 400-600° C. The system may further comprise a recorder to record a narrow transition of an alkaline-earth vapor interaction with the laser beam. The slide may comprise a notch in a corner to expose the underlying exterior surface of the vapor cell to form a cold spot for condensation of the alkaline-earth material.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIG. 3A is a schematic diagram illustrating a plan view of a first slide, according to an embodiment herein;

FIG. 3B is a schematic diagram illustrating a plan view of a second slide, according to an embodiment herein;

FIG. 3C is a schematic diagram illustrating a plan view of a third slide, according to an embodiment herein;

FIG. 3D is a schematic diagram illustrating a plan view of a fourth slide, according to an embodiment herein;

FIG. 3E is a schematic diagram illustrating a perspective view of a plurality of slides, according to an embodiment herein;

FIG. 3F is a schematic diagram illustrating a perspective view of an assembly of slides arranged around a vapor cell, according to an embodiment herein;

FIG. 5D is schematic diagram illustrating a perspective view of an assembled vapor cell heating assembly, according to an embodiment herein;

FIG. 6A is a schematic diagram illustrating a perspective view of an unassembled vapor chamber assembly, used in accordance with the embodiments herein;

FIG. 6B is a schematic diagram illustrating a perspective view of an assembled vapor chamber assembly, used in accordance with the embodiments herein;

FIG. 8 is a block diagram illustrating a high temperature optical system, according to an embodiment herein.

DETAILED DESCRIPTION OF THE INVENTION

Figure 1:
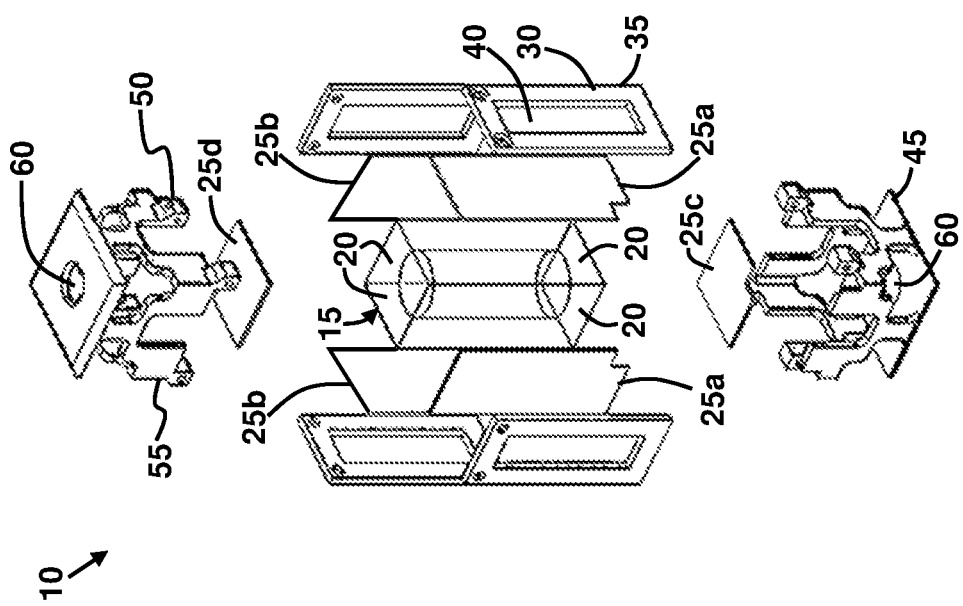
FIG. 1 is a schematic diagram illustrating an exploded view of a vapor cell heating assembly, according to an embodiment herein.

Embodiments of the disclosed invention, its various features and the advantageous details thereof, are explained more fully with reference to the non-limiting embodiments that are illustrated in the accompanying drawings and detailed in the following description. Descriptions of well-known components and processing techniques are omitted to not unnecessarily obscure what is being disclosed. Examples may be provided and when so provided are intended merely to facilitate an understanding of the ways in which the invention may be practiced and to further enable those of skill in the art to practice its various embodiments. Accordingly, examples should not be construed as limiting the scope of what is disclosed and otherwise claimed.

In the drawings, the size and relative sizes of layers and regions may be exaggerated for clarity. The embodiments herein provide a technique by which a pure atomic vapor source may be developed inside of a compact vapor cell, capable of supporting residual background pressures on the order of $10^{-6}$ Torr, and by providing a technique by which the vapor cell may be heated to the required temperatures to form the vapor without severely diminishing optical access to the vapor. Referring now to the drawings, and more particularly to FIGS. 1 through 8, where similar reference characters denote corresponding features consistently throughout, there are shown exemplary embodiments.

FIG. 1 illustrates a vapor cell heating assembly 10 comprising a vapor cell 15 comprising exterior surfaces 20. The vapor cell 15 may be configured as a rectangular prism, in one example, although other shapes and configurations are possible in accordance with the embodiments herein. A slide 25a-25d is disposed on at least one exterior surface 20 of the vapor cell 15. In one example, the slide 25a-25d comprises sapphire, although other materials are possible. The slide 25a-25d may be appropriately shaped depending on the configuration of the particular exterior surface 20 of the vapor cell 15 to which the slide 25a-25d is held against. For example, slide 25a, 25b are generally rectangular in shape while slide 25c, 25d are generally square in shape. A heating element 30 is disposed on the at least one exterior surface 20, and over the slide 25a, 25b such that the slide 25a, 25b is positioned between the exterior surface 20 of the vapor cell 15 and the heating element 30. The heating element 30 comprises a frame 35 and a first opening 40 in the frame 35 to pass light through the frame 35 to the at least one exterior surface 20. A shell 45 is disposed on the vapor cell 15 to hold the slide 25a-25d and heating element 30 to the vapor cell 15. The shell 45 comprises a plurality of structural elements 50, wherein each structural element 50 is disposed on a corresponding exterior surface 20 of the vapor cell 15 and aligned to adjacent structural elements 50 at edges 55 of the shell 45. Each structural element 50 comprises a second opening 60 to pass light through the structural element 50 to a respective exterior surface 20 of the vapor cell 15.

FIGS. 2A through 2D, with reference to FIG. 1, illustrate further views of the vapor cell 15. In an example, the vapor cell 15 may further comprise an interior surface 65 defining an inner chamber 70 comprising a vacuum of less than or equal to $10^{-6}$ Torr and an alkaline-earth material. The inner chamber 70 may be configured having any suitable shape, geometry, or configuration including cylindrical, hexagonal, rectangular, among other configurations. In an example, the inner chamber 70 may comprise a plurality of plates adjacent to one another extending through the vapor cell 15. The inner chamber 70 is open throughout its length. The vapor cell 15 may comprise a body component 16 comprising a first end 17 and a second end 18. When configured as a rectangular prism, the body component 16 comprises four elongated sides 13, and a substantially square base 12 on the second end 18. In various examples, the vapor cell 15 may comprise at least one of sapphire, calcium fluoride ($CaF_2$), and europium-doped calcium fluoride ($CaF_2$:Eu) crystal material. The crystal material may be resistant to attack from alkaline-earth elements at high temperature (e.g., ≥550° C.) and is machinable. The vapor cell 15 comprises a first endcap 19 and a second endcap 21, wherein both the first and second endcaps 19, 21 are optically contact bonded in place on the first end 17 and second end 18, respectively, of the vapor cell 15. As mentioned, the vapor cell 15 may be configured in a rectangular prism configuration. In an example, the vapor cell 15 may comprise dimensions of approximately 2 inches×1 inch×1 inch, although other dimensions are possible. The inner chamber 70 may be milled, in an example, to be approximately ¾ inch, although other dimensions are possible. The interior surface 65 may be polished. The endcaps 19, 21 may respectively comprise dimensions of approximately ¼ inch×1 inch×1 inch, although other dimensions are possible.

All sides of the body component 16 comprises an exterior surface 20. Each endcap 19, 21 comprises a corner 81. The corner 81 may be any of the four corners of the corresponding endcaps 19, 21, when the vapor cell 15 is configured as a prism. In other shapes and configurations of the vapor cell 15, the corner 81 may be considered as one of the distal edge regions of the vapor cell 15 along each face of the vapor cell 15. The exterior surface 20 of the body component 16 also extend to the endcaps 19, 21 upon optical contact bonding of the endcaps 19, 21 to the body component 16. For the purposes of the description herein, the corner 81 of the vapor cell 15 refers to the corners of the endcaps 19, 21.

Figure 2C:
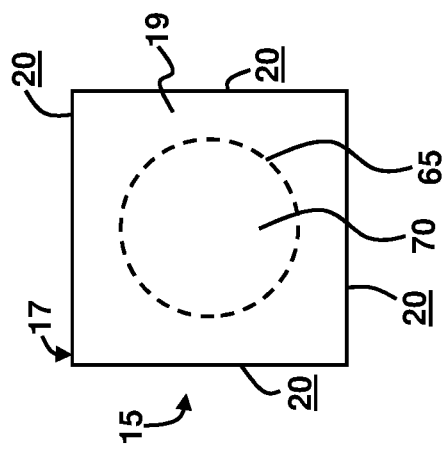
FIG. 2C is a schematic diagram illustrating a bottom view of the vapor cell of FIG. 2A, according to an embodiment herein.
Figure 2D:
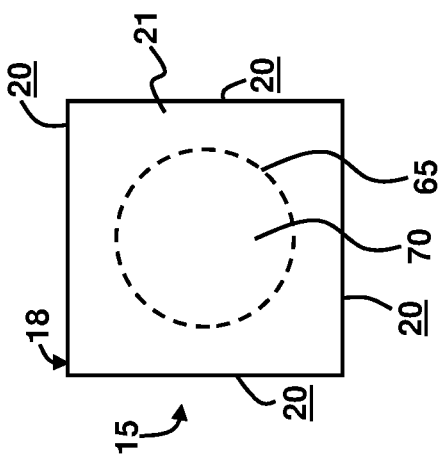
FIG. 2D is a schematic diagram illustrating a top view of the vapor cell of FIG. 2A, according to an embodiment herein.
Figure 2A:
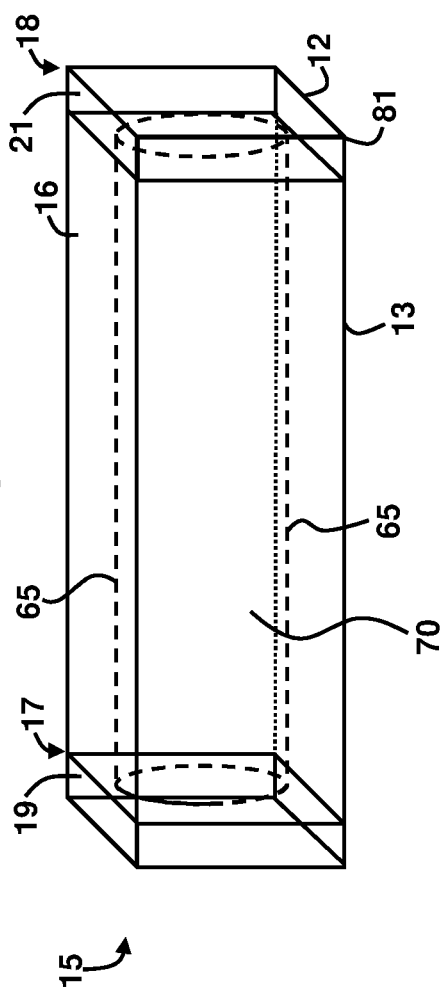
FIG. 2A is a schematic diagram illustrating a perspective view of a vapor cell, according to an embodiment herein.
Figure 2B:
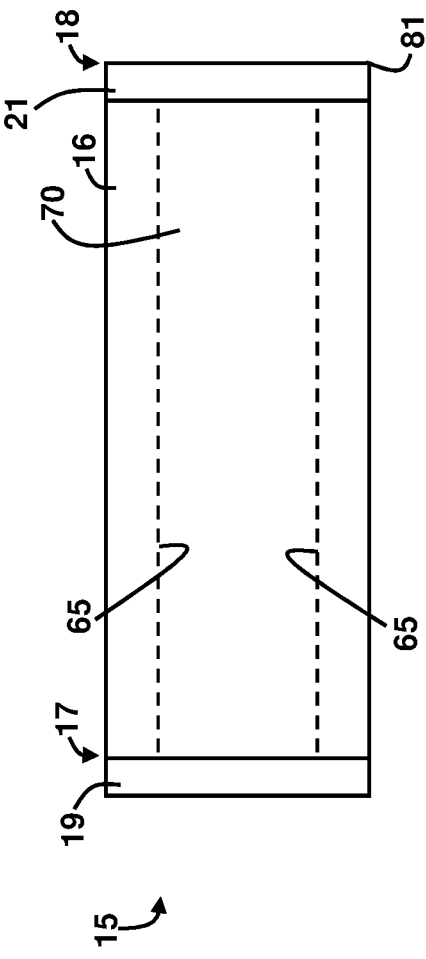
FIG. 2B is schematic diagram illustrating a front view of the vapor cell of FIG. 2A, according to an embodiment herein.

In an example, the assembly 10 may comprise a plurality of slides 25a-25d, wherein each exterior surface 20 of the vapor cell 15 has a slide 25a-25d disposed thereon. The plurality of slides 25a-25d may be appropriately dimensioned and configured to align with the corresponding dimension and configuration of an exterior surface 20 of the vapor cell 15. FIGS. 3A through 3F, with reference to FIGS. 1 through 2D, illustrate example slides 25a-25d in accordance with the embodiments herein. Each slide 25a comprises a body portion 26a and a notch 75a in a corner 80a, which is configured to be positioned and aligned adjacent to the notch 75a in an adjacent slide 25a to expose the underlying exterior surface 20 of the vapor cell 15 at a corner 81 of the exterior surfaces 20 of the vapor cell 15. Slide 25c also comprises a body portion 26c and a notch 75c, which is configured to be positioned and aligned adjacent to the notch 75a in an adjacent slide 25a. In this regard, the plurality of slides 25a, 25c are suitably positioned to align the notches 75a, 75c of the plurality of slides 25a, 25c with respect to one another to expose the exterior surface 20 at a corner 81 of the vapor cell 15. FIG. 3B illustrates slide 25b comprising a body portion 26b, which is configured to be positioned and aligned adjacent to slide 25a. FIG. 3D illustrates slide 25d comprising body portion 26d, which is configured to be positioned and aligned adjacent to slides 25a, 25b and away from the notch 75a of slide 25a. The slides 25b, 25d are notchless. FIG. 3E, with reference to FIGS. 1 through 3D, illustrates an example of a plurality of slides 25a, 25b adjacent with one another such that the notches 75a of adjacent slides 25a, align at a corner 80a of the slides 25a. FIG. 3F, with reference to FIGS. 1 through 3E, shows the underlying vapor cell 15 under the aligned plurality of slides 25a-25d. The notches 75a, 75c create a cold spot for calcium condensation on/in the vapor cell 15.

Figure 4C:
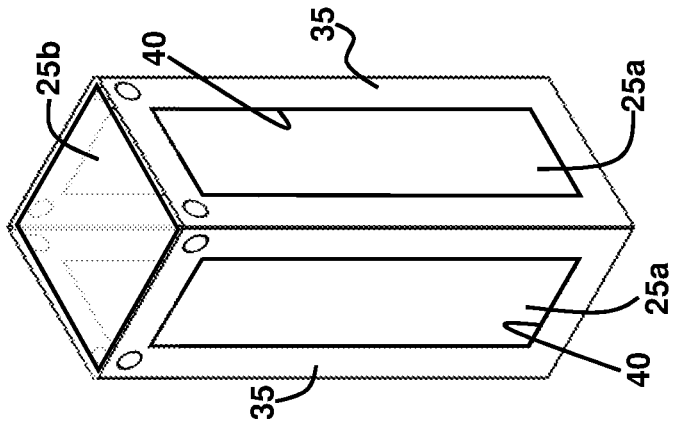
FIG. 4C is a schematic diagram illustrating a perspective view of a plurality of heating elements arranged around a vapor cell, according to an embodiment herein.
Figure 4B:
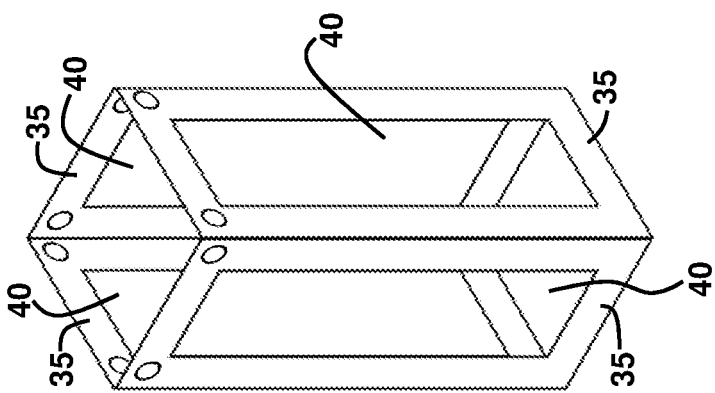
FIG. 4B is a schematic diagram illustrating a perspective view of a plurality of heating elements, according to an embodiment herein.
Figure 4A:
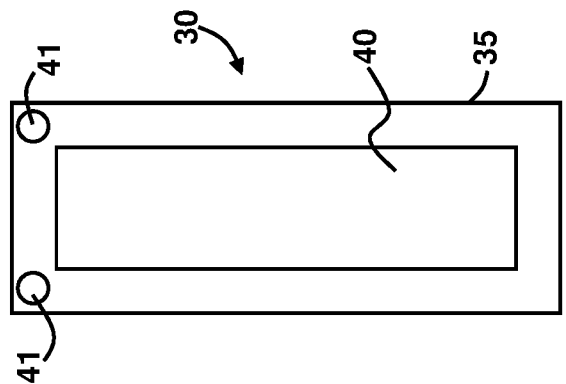
FIG. 4A is a schematic diagram illustrating a plan view of a heating element, according to an embodiment herein.

FIG. 4A, with reference to FIGS. 1 through 3F, illustrates a heating element 30 in accordance with an embodiment herein. The heating element 30 may comprise tungsten encased in aluminum nitride. The frame 35 may be substantially rectangular in shape, although other configurations are possible depending on the corresponding shape of the vapor cell 15. The frame 35 is positioned on each of the elongated sides 13 of the vapor cell 15. The first opening 40 is positioned substantially in the center of the frame 35. The frame 35 comprises a pair of holes 41, which are configured to provide electrical connections to the heating element 30. FIG. 4B, with reference to FIGS. 1 through 4A, illustrates a plurality of heating elements 30 aligned with one another. FIG. 4C, with reference to FIGS. 1 through 4B, illustrates the plurality of heating elements 30 aligned with one another and arranged over the plurality of slides 25a to circumscribe the vapor cell 15, wherein the plurality of heating elements are disposed on the corresponding side exterior surfaces 20 of the vapor cell 15 with the slides 25a positioned in between the vapor cell 15 and the heating elements 30.

Figure 5C:
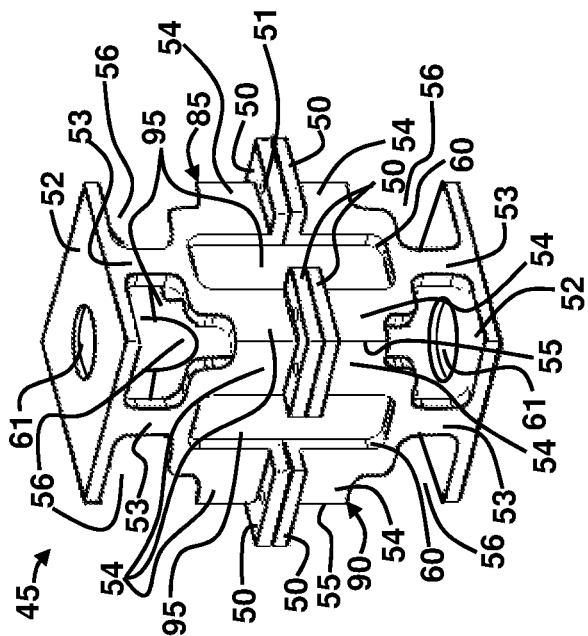
FIG. 5C is schematic diagram illustrating a perspective view of an assembled shell, according to an embodiment herein.
Figure 5A:
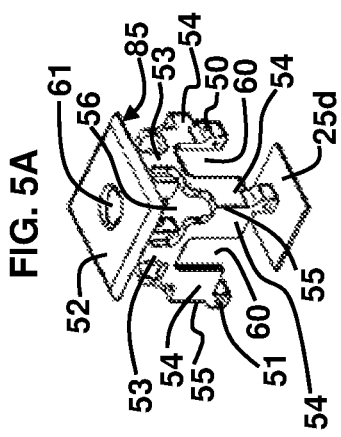
FIG. 5A is a schematic diagram illustrating a perspective view of a first portion of a shell, according to an embodiment herein.
Figure 5B:
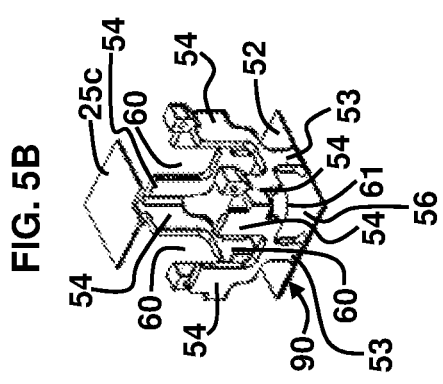
FIG. 5B is a schematic diagram illustrating a perspective view of a second portion of a shell, according to an embodiment herein.

FIGS. 5A through 5C, with reference to FIGS. 1 through 4C, illustrate a shell 45 that are configured to surround and retain the heating element 30 to the vapor cell 15. FIGS. 5A and 5B further illustrate the slides 25b shown to be aligned with the shell 45. In an example, the shell 45 comprises copper, although other materials are possible. The shell 45 may comprise an integral first portion 85 and a complementary integral second portion 90 aligned to the integral first portion 85 to form an interior volume 95. The interior volume 95 is substantially a hollow region to accommodate the vapor cell 15, slides 25a-25d, and shell 45. FIG. 5C illustrates the integral first portion 85 aligned with the integral second portion 90. Each of the integral first portion 85 and the integral second portion of the shell 45 comprises a plurality of structural elements 50, wherein each structural element 50 of the integral first portion 85 is aligned to an adjacent structural element 50 of the integral second portion 90.

The aligned structural elements 50 may comprise peg-like structures as shown in FIGS. 5A and 5B, or they may be configured as block-like structures as shown in FIGS. 5C and 5D. As such, the structural elements 50 may be provided in any suitable configuration to facilitation the alignment of the integral first portion 85 with the integral second portion 90. In an example, each of the structural elements 50 comprises at least one hole 51 to accommodate a pin, etc. (not shown) to retain the integral first portion 85 to the integral second portion 90. Each of the integral first portion 85 and the integral second portion 90 comprises a base 52 with a hole 61 configured therein. In an example, the base 52 comprises a substantially square shape, although other shapes and configurations are possible. A neck 53 extends from each side of the base 52. A pair of flanges 54 extend from the neck 53, wherein the pair of flanges 54 are spaced apart from one another creating a second opening 60 in each structural element 50, wherein the second opening 60 is configured in between each of the pair of flanges 54. When the integral first portion 85 aligns with the integral second portion 90, the second openings 60 of the corresponding first and second portions 85, 86 also align thereby creating one extended second opening 60, as depicted in FIG. 5C. Each of the integral first portion 85 and the integral second portion 90 comprise an edge 55 and a hole 56 aligned on the edge 55, wherein the hole creates the separation between each neck 53 extending from the base 52 and an adjacent neck 53. Moreover, the hole 56 together with the second opening 60 creates the shape and contour of the flanges 54.

As further shown in FIG. 5D, with reference to FIGS. 1 through 5C, the shell 45 is configured to hold the slides 25a-25d and heating element 30 to the vapor cell exterior surface 20 in the interior volume 95 of the first portion 85 when joined to the second portion 90. The second openings 60 are configured to pass light therethrough to the exterior surface 20 of the vapor cell 15. Furthermore, each structural element 50 is disposed on a corresponding exterior surface 20 of the vapor cell 15 and aligned to adjacent structural elements 50 at edges 55.

FIG. 6A, with reference to FIGS. 1 through 5D, illustrates a schematic diagram of an unassembled vapor chamber assembly 100, used in accordance with the vapor cell heating assembly 10. The vapor chamber assembly 100 comprises a feedthrough component 105 comprising a handle end 107, a first flange 110, and a manipulator end 110. The handle end 107 comprises a mechanism 108 to control the manipulator end 115. In an example, the manipulator end 115 comprises an elongated shaft 116 with a tip 117 configured to move, grasp, release, and otherwise control movement of a component to which it attaches. The vapor chamber assembly 100 further includes a sealing component 120 comprising a second flange 122, a hollow tube 125, and a third flange 130. The hollow tube 125 connects to each of the second flange 122 and the third flange 130 such that the hollow tube 125 is positioned between the second flange 122 and the third flange 130. The second flange 122, hollow tube 125, and third flange 130 comprise an aligned open central area 127 to accommodate the manipulator end 115 of the feedthrough component 105. The vapor cell heating assembly 10 is mounted in a platform 135, which is configured to be held in a vacuum chamber 140. In an example, the vacuum chamber 140 may be constructed from stainless steel material. Once the platform 135 containing the vapor cell heating assembly 10 is seated in the vacuum chamber 140 through opening 143a, the sealing component 120 is connected to a first end 141 of the vacuum chamber 140. A fourth flange 145 is attached to a second end 142 of the vacuum chamber 140 to completely seal the vacuum chamber 140.

FIG. 6B, with reference to FIGS. 1 through 6A, illustrates a schematic diagram of an assembled vapor chamber assembly 100, used in accordance with the vapor cell heating assembly 10. The vapor chamber assembly 100 is provided to retain the vapor cell heating assembly 10 comprising the vapor cell 15. The vapor cell 15 may be constructed from highly polished crystals bonded together under vacuum in the vacuum chamber 140. In an example, the first endcap 19 is optically contact bonded to the first end 17 of the vapor cell 15 prior to insertion of the vapor cell heating assembly 10 into the vacuum chamber 140 such that the first endcap 19 is positioned as the bottom portion of the vapor cell 15. However, depending on the configuration of the vapor cell 15, either the first end 17 or the second end 18 may be the bottom or top of the vapor cell 15. For the purposes of the description herein, the first end 17 is provided as the bottom portion of the vapor cell 15. The optical contact bonding of the second endcap 21 to the body component 16 of the vapor cell 15 occurs under vacuum in the vacuum chamber 140 upon completely sealing the vacuum chamber 140 with the sealing component 120 and the fourth flange 145. In an example, the platform 135 may hold the body component 16 while the manipulator end 115 of the feedthrough component 105 guides the second endcap 21 in a substantially linear motion technique to align the second endcap 21 with the body component 16 to allow for the optical contact bonding between the second endcap 21 and body component 16 to occur.

The vacuum chamber 140 is sealed and evacuated to a pressure of $\leq 10^{-6}$ Torr. The vacuum chamber 140 is then vented to an inert gas environment. According to an example, the fourth flange 145 is removed under an over-pressurized inert gas environment, to reduce oxygen impurities. According to another example, the assembly 130, and everything above the assembly 130, and the crystals are inserted directly into the vapor cell 15 before re-assembling the assembly 130. The body component 16 of the vapor cell 15 is inserted into the platform 135, the alkaline-earth metal of interest is placed inside the inner chamber 70, and the second endcap 21 is placed on the body component 16 but is not optically contacted together. The linear motion feedthrough component 105 is secured on the second flange 122 such that the first flange 110 and the second flange 122 align with one another. The manipulator end 115 of the feedthrough component 105 is lowered to the point of almost making contact to an adhesive layer (not shown) on the second endcap 21 of the vapor cell 15 and then raised to lift the second endcap 21 only high enough to allow the inner chamber 70 of the vapor cell 15 to be evacuated. The vacuum chamber 140 is pumped down once again to a pressure of $\leq 10^{-6}$ Torr. The linear motion manipulator end 114 of the feedthrough component 105 is lowered and the second endcap 21 of the vapor cell 15 is pressed into optical contact with the body component 16 of the vapor cell 15, thereby sealing the metal inside the vapor cell 15.

In an example, the vapor cell heating assembly 10 may be suspended in the vacuum chamber 140 by springs cut from alumina ceramic (not shown). The alumina springs provide a long thermal path to the vacuum chamber 140, which reduces the conductive load of the vacuum chamber 140.

FIGS. 1 through 6B illustrate a generally vertical configuration of the vapor cell heating assembly 10 and vapor chamber assembly 100. However, this is only one example, and as such other embodiments are possible, such as a horizontal configuration of the vapor cell heating assembly 10 and vapor chamber assembly 100, whereby the vapor cell heating assembly 10 may be inserted into the vapor chamber assembly 100 horizontally through opening 143b of the vacuum chamber 140. Accordingly, the embodiments herein are not restricted to any particular configuration for insertion of the vapor cell heating assembly 10 into the vapor chamber assembly 100.

Figure 7A:
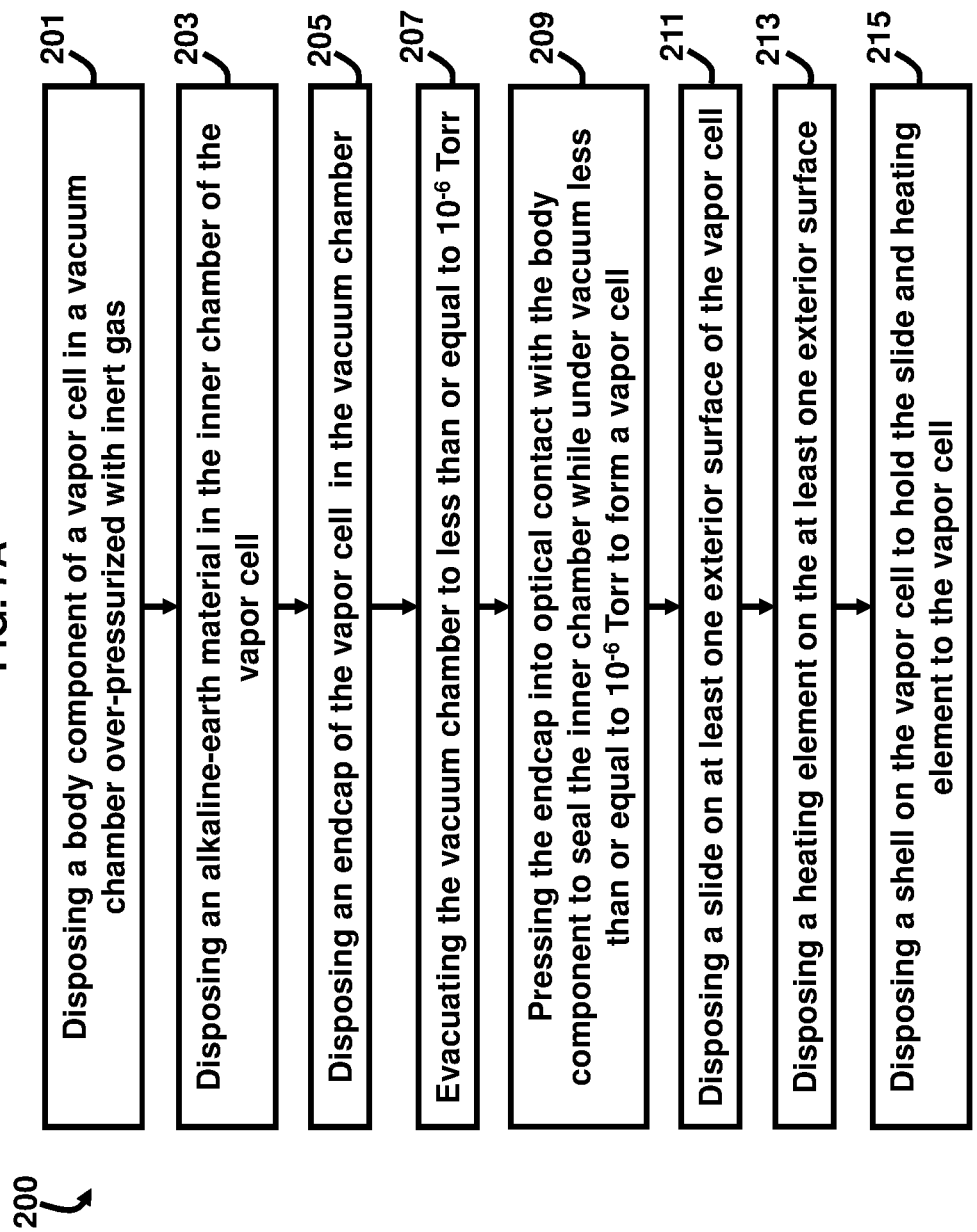
FIG. 7A is a flowchart illustrating a method of manufacturing a vapor cell heating assembly, according to an embodiment herein.

FIG. 7A, with reference to FIGS. 1 through 6B, is a flowchart illustrating a method 200 of manufacturing a vapor cell heating assembly 10. Block 201 of the method 200 describes disposing a body component 16 in a vacuum chamber 140 over-pressurized with inert gas, wherein the body component 16 comprises an inner chamber 70 open to the inside of the vacuum chamber 140. Block 203 describes disposing an alkaline-earth material in the inner chamber 70. Block 205 describes disposing an endcap 21 of a vapor cell 15 in the vacuum chamber 140. Block 207 describes evacuating the vacuum chamber 140 to less than or equal to $10^{-6}$ Torr. Block 209 describes pressing the endcap 21 into optical contact with the body component 16 to seal the inner chamber 70 while under vacuum less than or equal to $10^{-6}$ Torr to form a vapor cell 15. Block 211 describes disposing a slide 25a-25d on at least one exterior surface 20 of the vapor cell 15. Block 213 describes disposing a heating element 30 on the at least one exterior surface 20, the heating element 30 comprising a frame 35 and a first opening 40 in the frame 35 to pass light through the frame 35 to the at least one surface 20. Block 215 describes disposing a shell 45 on the vapor cell 15 to hold the slide 25a-25d and heating element 30 to the vapor cell 15, wherein the shell 45 comprises a plurality of structural elements 50, each structural element 50 disposed on a corresponding exterior surface 20 of the vapor cell 15 and aligned to adjacent structural elements 50 at edges 55, and wherein each structural element 50 comprises a second opening 60 to pass light through the structural element 50 to a respective exterior surface 20.

Figure 7B:
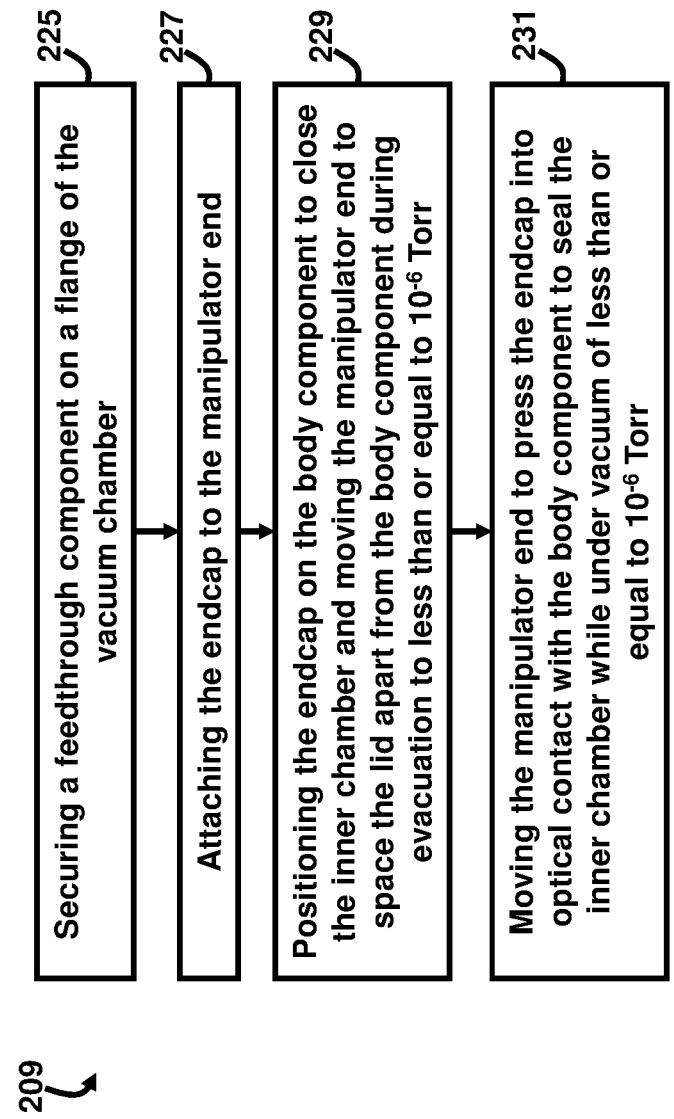
FIG. 7B is a flowchart illustrating a method of optically contacting components of a vapor cell heating assembly, according to an embodiment herein.

As shown in the flowchart of FIG. 7B, with reference to FIGS. 1 through 7A, with reference to block 209 of method 200, pressing the endcap 21 into optical contact with the body component 16 to seal the inner chamber 70 may comprise, as provided in block 225, securing a feedthrough component 105 on a flange 122 of the vacuum chamber 140, wherein the feedthrough component 105 comprises a manipulator end 115 to move within the vacuum chamber 140 in response to input from outside the vacuum chamber 140. Block 227 provides attaching the endcap 21 to the manipulator end 115. Block 229 provides positioning the endcap 21 on the body component 16 to close the inner chamber 70 and moving the manipulator end 115 to space the endcap 21 apart from the body component 16 during evacuation to less than or equal to $10^{-6}$ Torr. Block 231 provides moving the manipulator end 115 to press the endcap 21 into optical contact with the body component 16 to seal the inner chamber 70 while under vacuum of less than or equal to $10^{-6}$ Torr. The method may further comprise heating the body component 16 prior to pressing the endcap 21 into optical contact with the body component 16 to seal the inner chamber 70 while under vacuum less than or equal to $10^{-6}$ Torr. The alkaline-earth material may comprise at least one of calcium, strontium, magnesium, barium, radium, zinc, cadmium, and ytterbium. The vapor cell 15 may comprise at least one of sapphire, calcium fluoride ($CaF_2$), and europium-doped calcium fluoride ($CaF_2$:Eu). The heating element 30 may comprise tungsten encased in aluminum nitride. The shell 45 may comprise copper.

Figure 7C:
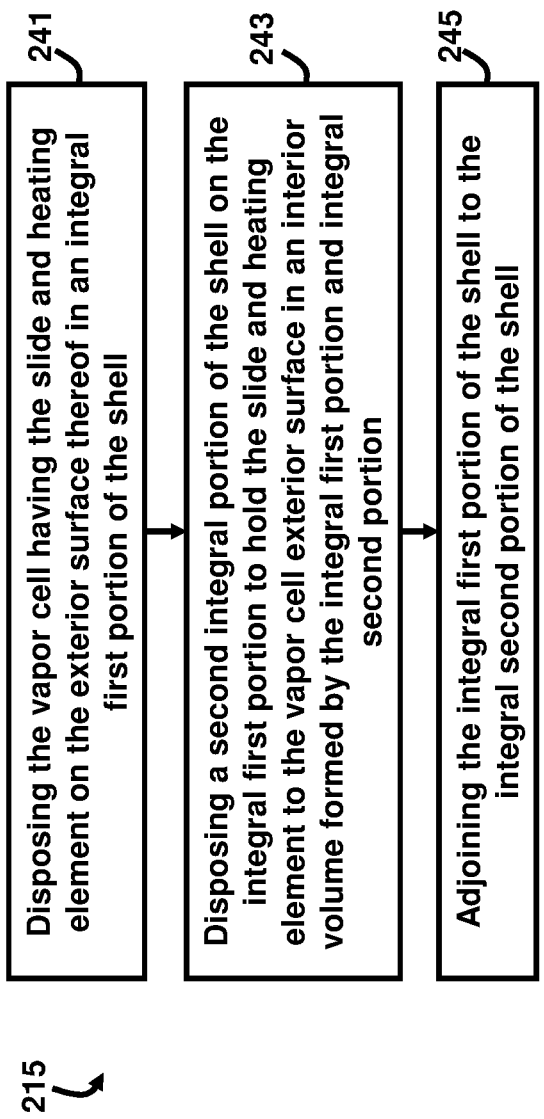
FIG. 7C is a flowchart illustrating a method of contacting a shell on a vapor cell, according to an embodiment herein.

As shown in the flowchart of FIG. 7C, with reference to FIGS. 1 through 7B, with reference to block 215 of method 200, disposing the shell 45 on the vapor cell 15 may comprise, as provided in block 241, disposing the vapor cell 15 having the slide 25a-25d and heating element 30 on the exterior surface 20 thereof in an integral first portion 85 of the shell 45. Block 243 provides disposing a second integral portion of the shell 45 on the integral first portion 85 to hold the slide 25a and heating element 30 to the vapor cell exterior surface 20 in an interior volume 95 formed by the integral first portion 85 and integral second portion 90. Block 245 provides adjoining the integral first portion 85 of the shell 45 to the integral second portion 90 of the shell 45.

FIG. 8, with reference to FIGS. 1 through 7C, is a block diagram illustrating a high temperature optical system 150, in accordance with the embodiments herein. The system 150 comprises the vapor cell heating assembly 10, as described above, which comprises the vapor cell 15 comprising the exterior surface 20 and the interior surface 65 defining the sealed inner chamber 70 comprising a vacuum of less than or equal to $10^{-6}$ Torr and an alkaline-earth material 175. The slide 25a-25d is disposed on the exterior surface 20 of the vapor cell 15. The heating element 30 is disposed on the exterior surface 20. The heating element 30 comprises the frame 35 and the first opening 40 in the frame 35 to pass light therethrough to the exterior surface 20 of the vapor cell 15. The shell 45 is disposed on the vapor cell 15 to hold the slide 25a-25d and the heating element 30 to the vapor cell 15, wherein the shell 45 comprises the plurality of structural elements 50. Each structural element 50 is aligned to adjacent structural elements 50, wherein each structural element 50 comprises the second opening 60 to pass light therethrough to the exterior surface 20 of the vapor cell 15. The high temperature optical system 150 further comprises a laser source 155 to project a laser beam 160 through the first and second openings 40, 60, the exterior surface 20, the interior surface 65, and into the sealed inner chamber 140 of the vapor cell 15.

The alkaline-earth material 175 may be in the form of a vapor between 450-600° C. The system 150 may further comprise a recorder 165 to record a narrow transition of an alkaline-earth vapor interaction with the laser beam 160. In an example, the recorder 165 may comprise a computer-implemented system with processing capabilities to process the alkaline-earth vapor interaction with the laser beam 160. The slide 25*a*, 25*c* may comprise a notch 75*a*, 75*c* in a corner 80*a*, 80*c* to expose the underlying exterior surface 20 of the vapor cell 15 to form a cold spot 170 for condensation of the alkaline-earth material 175.

The embodiments herein provide a vapor cell 15 for alkaline-earth-like atoms formed from alkali-resistant glasses or crystalline materials inside of an ultrahigh vacuum chamber 140, using an optical contact bond (i.e., Van Der Wals bond) to seal the vapor cell 15. Moreover, the embodiments herein provide for a high temperature, low outgassing, heating and insulation assembly 10 for use in high vacuum environments for spectroscopic applications where optical transparency is required in all directions.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Those skilled in the art will recognize that the embodiments herein can be practiced with modification within the spirit and scope of the appended claims.

What is claimed is:

1. A vapor cell heating assembly comprising:
   a vapor cell comprising exterior surfaces;
   a slide disposed on at least one exterior surface of the vapor cell;
   a heating element disposed on the at least one exterior surface, the heating element comprising a frame and a first opening in the frame to pass light through the frame to the at least one exterior surface; and
   a shell disposed on the vapor cell to hold the slide and heating element to the vapor cell,
   wherein the shell comprises a plurality of structural elements, each structural element disposed on a corresponding exterior surface of the vapor cell and aligned to adjacent structural elements at edges, and wherein each structural element comprises a second opening to pass light through the structural element to a respective exterior surface.

2. The assembly of claim 1, wherein the vapor cell further comprises an interior surface defining a sealed inner chamber comprising a vacuum of less than or equal to $10^{-6}$ Torr and an alkaline-earth material.

3. The assembly of claim 2, wherein the vapor cell comprises at least one of sapphire, calcium fluoride ($CaF_2$), and europium-doped calcium fluoride ($CaF_2$:Eu).

4. The assembly of claim 1, further comprising:
   a plurality of slides, wherein each exterior surface of the vapor cell has a slide disposed thereon; and
   a plurality of heating elements, wherein the plurality of heating elements circumscribe the vapor cell disposed on corresponding side exterior surfaces thereof.

5. The assembly of claim 4, wherein each slide comprises a notch in a corner adjacent to the notch in adjacent slides to expose the underlying exterior surface of the vapor cell at a corner of the exterior surfaces.

6. The assembly of claim 1, wherein the heating element comprises tungsten encased in aluminum nitride.

7. The assembly of claim 1, wherein the shell comprises copper.

8. The assembly of claim 7, wherein the shell comprises an integral first portion and a complementary integral second portion aligned to the integral first portion to form an interior volume and hold the slide and heating element to the vapor cell exterior surface in the interior volume of the first portion joined to the second portion.

9. A method of manufacturing a vapor cell heating assembly, the method comprising:
   disposing a body component of a vapor cell in a vacuum chamber over-pressurized with inert gas, wherein the body component comprises an inner chamber open to the vacuum chamber;
   disposing an alkaline-earth material in the inner chamber;
   disposing an endcap of the vapor cell in the vacuum chamber;
   evacuating the vacuum chamber to less than or equal to $10^{-6}$ Torr;
   pressing the endcap into optical contact with the body component to seal the inner chamber while under vacuum less than or equal to $10^{-6}$ Torr to form a vapor cell;
   disposing a slide on at least one exterior surface of the vapor cell;
   disposing a heating element on the at least one exterior surface, the heating element comprising a frame and a first opening in the frame to pass light through the frame to the at least one exterior surface; and
   disposing a shell on the vapor cell to hold the slide and heating element to the vapor cell,
   wherein the shell comprises a plurality of structural elements, each structural element disposed on a corresponding exterior surface of the vapor cell and aligned to adjacent structural elements at edges, and wherein each structural element comprises a second opening to pass light through the structural element to a respective exterior surface.

10. The method of claim 9, wherein pressing the endcap into optical contact with the body component to seal the inner chamber comprises:
    securing a feedthrough component on a flange of the vacuum chamber, wherein the feedthrough component comprises a manipulator end to move within the vacuum chamber in response to input from outside the vacuum chamber;
    attaching the endcap to the manipulator end;
    positioning the endcap on the body component to close the inner chamber and moving the manipulator end to space the endcap apart from the body component during evacuation to less than or equal to $10^{-6}$ Torr; and
    moving the manipulator end to press the endcap into optical contact with the body component to seal the inner chamber while under vacuum of less than or equal to $10^{-6}$ Torr.

11. The method of claim 9, further comprising heating the body component prior to pressing the endcap into optical contact with the body component to seal the inner chamber while under vacuum less than or equal to $10^{-6}$ Torr.

12. The method of claim 9, wherein the alkaline-earth material comprises at least one of calcium, strontium, magnesium, barium, radium, zinc, cadmium, and ytterbium.

13. The method of claim 9, wherein the vapor cell comprises at least one of sapphire, calcium fluoride ($CaF_2$), and europium-doped calcium fluoride ($CaF_2$:Eu).

14. The method of claim 9, wherein the heating element comprises tungsten encased in aluminum nitride.

15. The method of claim 9, wherein the shell comprises copper.

16. The method of claim 9, wherein disposing the shell on the vapor cell comprises:
  disposing the vapor cell having the slide and heating element on the exterior surface thereof in an integral first portion of the shell;
  disposing a second integral portion of the shell on the integral first portion to hold the slide and heating element to the vapor cell exterior surface in an interior volume formed by the integral first portion and integral second portion; and
  adjoining the integral first portion of the shell to the integral second portion of the shell.

17. A high temperature optical system comprising:
a vapor cell heating assembly comprising:
  a vapor cell comprising an exterior surface and an interior surface defining a sealed inner chamber comprising a vacuum of less than or equal to $10^{-6}$ Torr and an alkaline-earth material;
  a slide disposed on the exterior surface of the vapor cell;
  a heating element disposed on the exterior surface, the heating element comprising a frame and a first opening in the frame to pass light therethrough to the exterior surface; and
  a shell disposed on the vapor cell to hold the slide and heating element to the vapor cell,
  wherein the shell comprises a plurality of structural elements, each structural element aligned to adjacent structural elements, and wherein each structural element comprises a second opening to pass light therethrough to the exterior surface; and
a laser source to project a laser beam through the first and second openings, the exterior surface, the interior surface, and into the sealed inner chamber of the vapor cell.

18. The system of claim 17, wherein the alkaline-earth material is in the form of a vapor between 400-600° C.

19. The system of claim 18, further comprising a recorder to record a narrow transition of an alkaline-earth vapor interaction with the laser beam.

20. The system of claim 17, wherein the slide comprises a notch in a corner to expose the underlying exterior surface of the vapor cell to form a cold spot for condensation of the alkaline-earth material.

* * * * *